(12) United States Patent
Watanabe

(10) Patent No.: US 12,412,753 B2
(45) Date of Patent: Sep. 9, 2025

(54) SEMICONDUCTOR DEVICE AND MANUFACTURING METHOD OF THE SAME

(71) Applicant: SONY SEMICONDUCTOR SOLUTIONS CORPORATION, Kanagawa (JP)

(72) Inventor: Tsuyoshi Watanabe, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 503 days.

(21) Appl. No.: 17/756,576

(22) PCT Filed: Sep. 17, 2020

(86) PCT No.: PCT/JP2020/035281
§ 371 (c)(1),
(2) Date: May 27, 2022

(87) PCT Pub. No.: WO2021/117310
PCT Pub. Date: Jun. 17, 2021

(65) Prior Publication Data
US 2023/0005759 A1    Jan. 5, 2023

(30) Foreign Application Priority Data

Dec. 9, 2019 (JP) ................................ 2019-221783

(51) Int. Cl.
*H01L 23/31* (2006.01)
*H01L 21/56* (2006.01)
(Continued)

(52) U.S. Cl.
CPC ........ *H01L 21/563* (2013.01); *H01L 23/3128* (2013.01); *H01L 23/66* (2013.01);
(Continued)

(58) Field of Classification Search
CPC ........................... H01L 23/3128; H01L 23/66
See application file for complete search history.

(56) References Cited

U.S. PATENT DOCUMENTS 10,978,312 B2 * 4/2021 Yen ................... H01L 23/49548
11,574,881 B2 * 2/2023 Liu ...................... H01Q 1/2283
(Continued)

FOREIGN PATENT DOCUMENTS

CN         102460686 A     5/2012
CN         104022345 A     9/2014
(Continued)

OTHER PUBLICATIONS

International Search Report and Written Opinion of PCT Application No. PCT/JP2020/035281, issued on Dec. 22, 2020, 11 pages of ISRWO.

*Primary Examiner* — Eugene Lee
(74) *Attorney, Agent, or Firm* — CHIP LAW GROUP

(57) ABSTRACT

Restrictions in placement of an antenna for performing transmission and reception of a signal by wireless communication when the antenna is used together with a CSP (Chip Size Package) are eliminated. A semiconductor device includes a chip size package and a substrate. The chip size package includes a semiconductor element. Further, the chip size package includes a connection portion that electrically connects the semiconductor element and an outside to each other. The substrate includes an antenna connected to the connection portion of the chip size package for performing transmission and reception of a signal by wireless communication. With this configuration, the semiconductor device performs transmission and reception of a signal to and from the outside through the antenna provided on the substrate.

16 Claims, 6 Drawing Sheets

(51) Int. Cl.
*H01L 23/00* (2006.01)
*H01L 23/66* (2006.01)

(52) U.S. Cl.
CPC .............. *H01L 24/16* (2013.01); *H01L 24/73* (2013.01); *H01L 2223/6677* (2013.01); *H01L 2224/16225* (2013.01); *H01L 2224/73204* (2013.01)

(56) References Cited

U.S. PATENT DOCUMENTS

| | | | |
|---|---|---|---|
| 2008/0096366 A1* | 4/2008 | Aoki | H01L 21/4846 438/455 |
| 2010/0062569 A1* | 3/2010 | Aoki | H05K 3/207 438/118 |
| 2012/0098089 A1 | 4/2012 | Tago | |
| 2014/0246745 A1 | 9/2014 | Kinugasa et al. | |
| 2017/0125895 A1* | 5/2017 | Baks | H01Q 23/00 |
| 2018/0076526 A1* | 3/2018 | Garcia | H01Q 19/30 |
| 2018/0166767 A1 | 6/2018 | Ito et al. | |
| 2018/0358685 A1* | 12/2018 | Han | H01Q 21/06 |
| 2019/0103680 A1* | 4/2019 | Liao | H01Q 21/065 |
| 2019/0288382 A1* | 9/2019 | Kamgaing | H01L 23/522 |
| 2019/0305430 A1* | 10/2019 | Thai | H01Q 1/2283 |
| 2019/0348749 A1* | 11/2019 | Thai | H01Q 1/243 |
| 2019/0393172 A1* | 12/2019 | Pietambaram | H01L 24/19 |

FOREIGN PATENT DOCUMENTS

| | | |
|---|---|---|
| CN | 104701304 A | 6/2015 |
| EP | 1471604 A1 | 10/2004 |
| JP | 2004-327641 A | 11/2004 |
| JP | 2014-170811 A | 9/2014 |
| JP | 2016-540389 A | 12/2016 |
| JP | 2018-098551 A | 6/2018 |
| KR | 10-2016-0067961 A | 6/2016 |
| WO | 2011/001992 A1 | 1/2011 |
| WO | 2015/088486 A1 | 6/2015 |

* cited by examiner

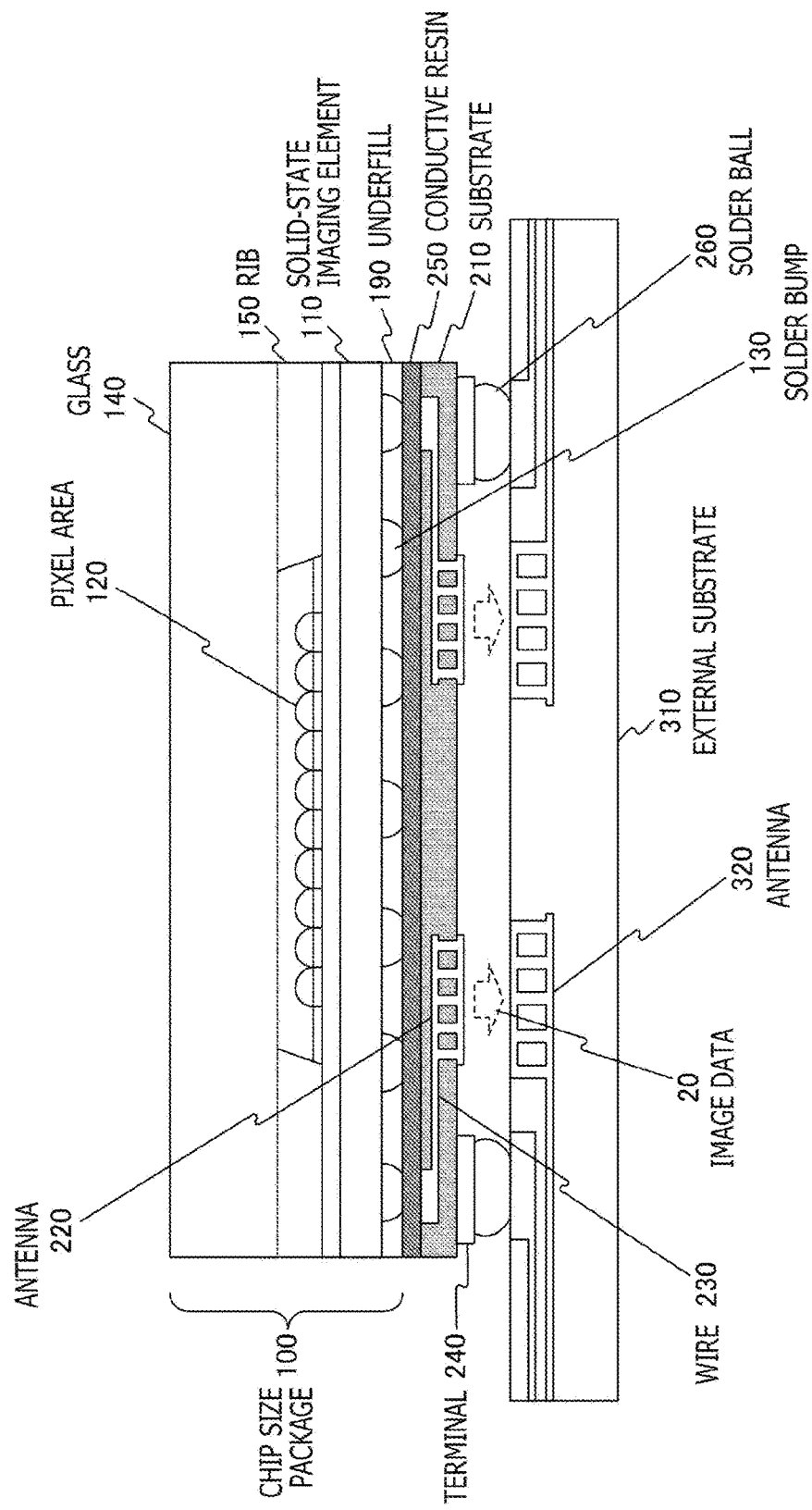

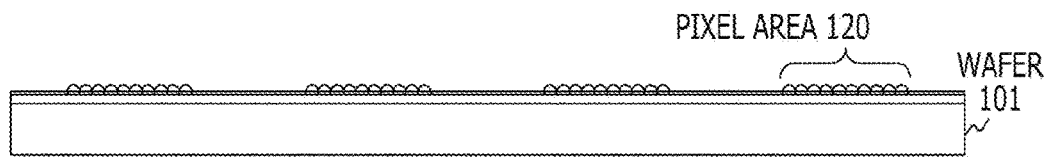
FIG. 2A
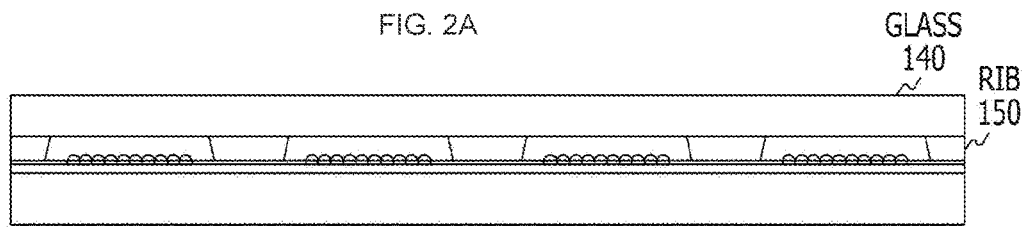
FIG. 2B
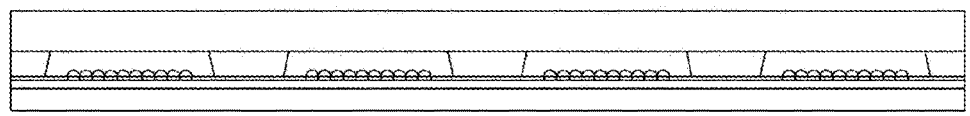
FIG. 2C  (POLISHING)
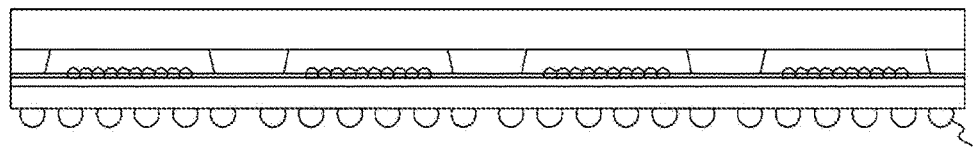
FIG. 2D
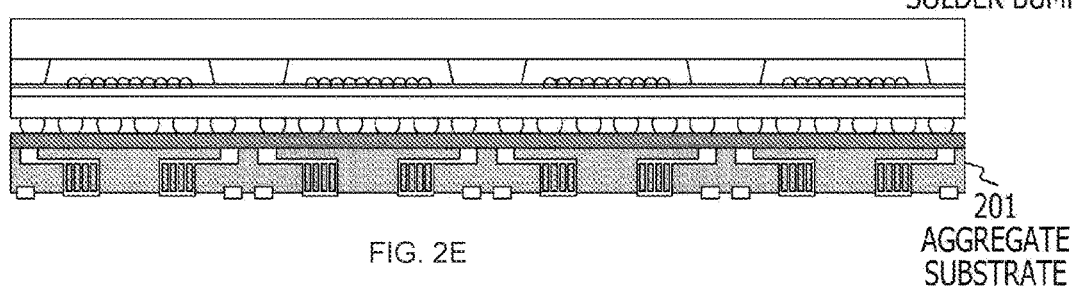
FIG. 2E
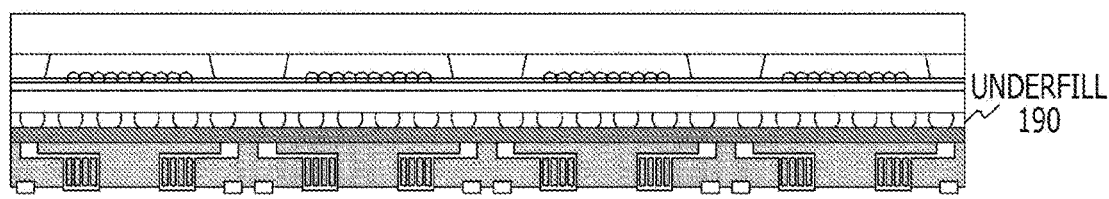
FIG. 2F
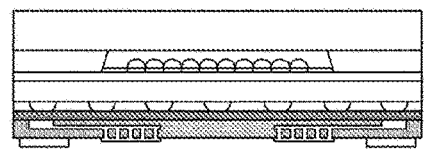
FIG. 2G  (INDIVIDUALIZATION)

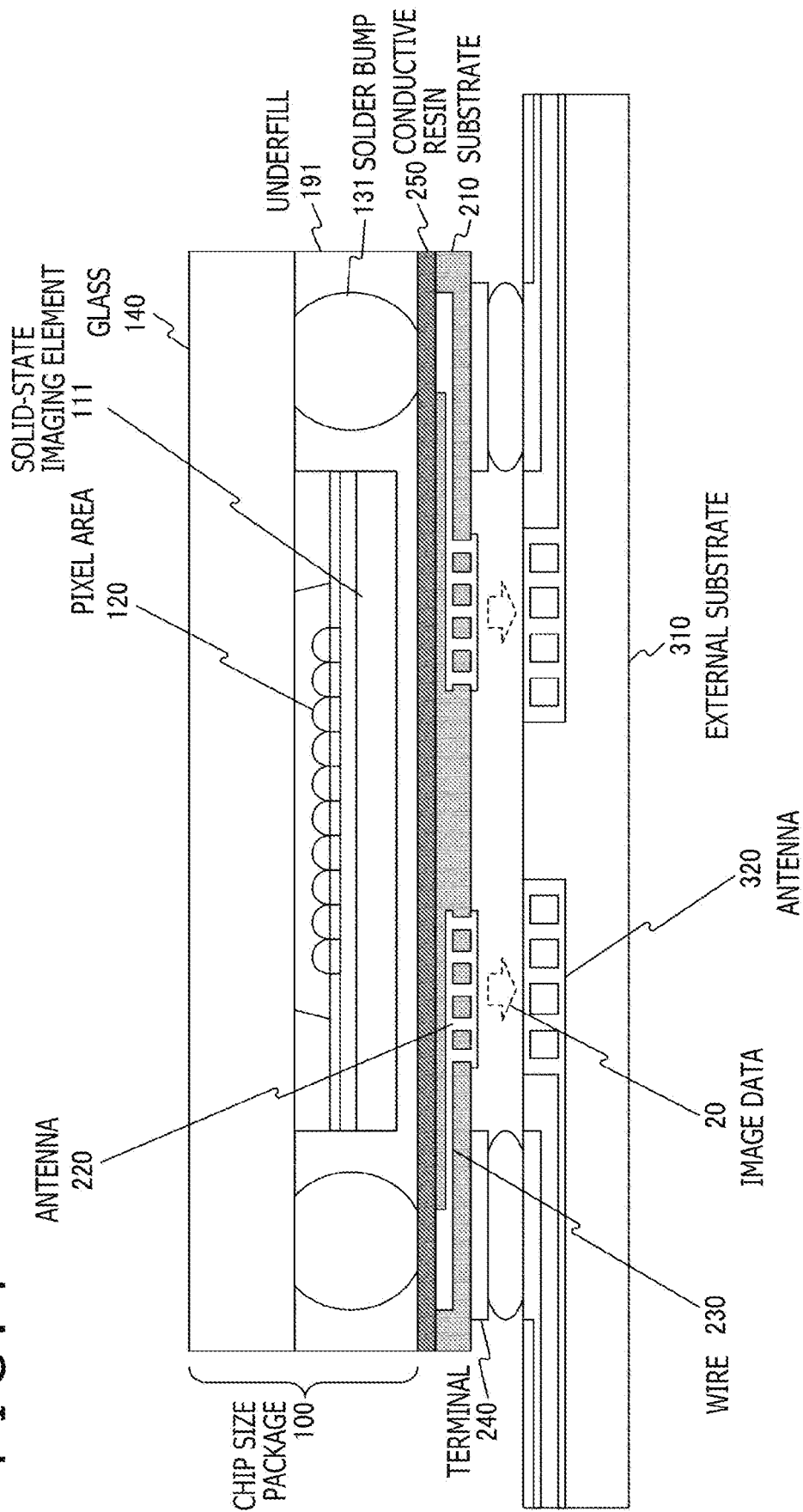

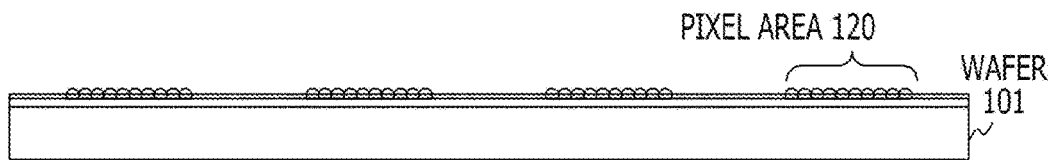
FIG. 5A
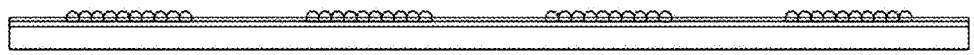
FIG. 5B     (POLISHING)
FIG. 5C     (DICING)
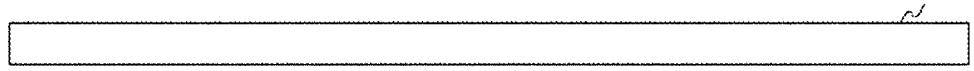
FIG. 5D
FIG. 5E
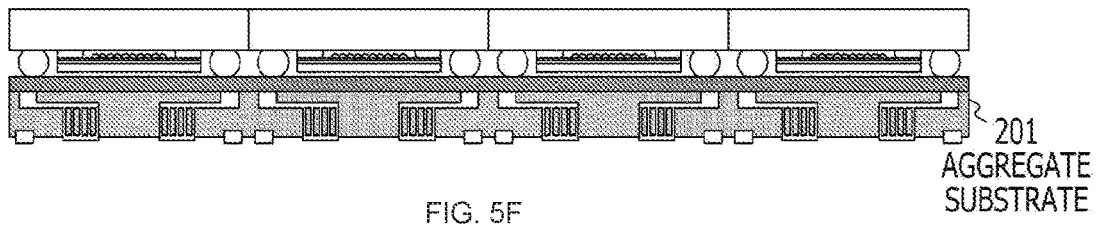
FIG. 5F
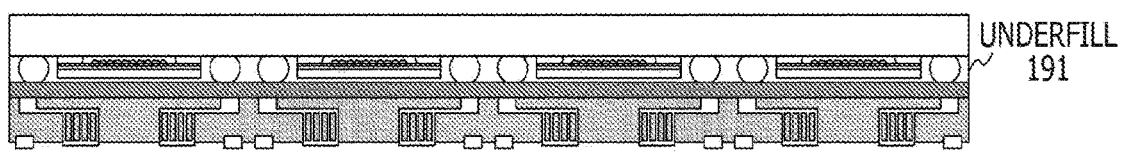
FIG. 5G
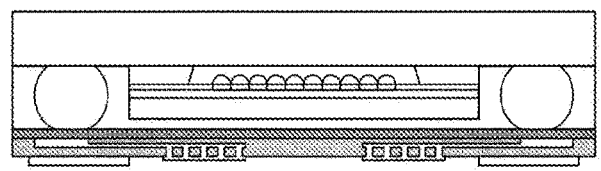
FIG. 5H     (INDIVIDUALIZATION)

SEMICONDUCTOR DEVICE AND MANUFACTURING METHOD OF THE SAME

CROSS REFERENCE TO RELATED APPLICATIONS

This application is a U.S. National Phase of International Patent Application No. PCT/JP2020/035281 filed on Sep. 17, 2020, which claims priority benefit of Japanese Patent Application No. JP 2019-221783 filed in the Japan Patent Office on Dec. 9, 2019. Each of the above-referenced applications is hereby incorporated herein by reference in its entirety.

TECHNICAL FIELD

The present technology relates to a semiconductor device. Particularly, the present technology relates to a semiconductor device that includes a CSP (Chip Size Package) and a manufacturing method of the same.

BACKGROUND ART

Cameras have increasingly been used for various applications and in various places, and as the needs for miniaturization of a camera increase, a demand for miniaturization of a package of a solid-state imaging device has increased. Meanwhile, the needs for enhancement in image quality of a camera are also high, and it is also necessary to achieve increase in pixel count and in frame rate in order to implement the enhancement in image quality for a solid-state imaging device. However, as the pixel count or the frame rate increases, also the amount of image data to be processed increases, and it becomes necessary to speed up output data of the solid-state imaging device. Such speeding up of output data increases the number of wires inside the package and increases the package size. In this regard, if an effort is made to reduce the package size by thinning the wires inside the package or by reducing the distance between the wires, then electromagnetic waves interfere with each other between the wires, causing noise to be generated. Therefore, routing of wires becomes long, and transmission loss of a signal occurs. Additionally, since terminals of the package become small, such a problem occurs that connection to an external substrate becomes difficult. Therefore, it has been proposed to place an antenna for transmission and reception inside a solid-state imaging device in the form of a CSP such that transmission and reception of data to and from an external substrate are performed by wireless communication (for example, refer to PTL 1).

CITATION LIST

Patent Literature

PTL 1

Japanese Patent Laid-Open No. 2014-170811

SUMMARY

Technical Problems

However, according to the conventional technology described above, since an antenna is provided at part of a rewiring layer of the CSP, the antenna cannot be increased in size, and there is the possibility that the antenna installation area may be limited. Further, there is the possibility that radio waves from the antenna interfere with circuitry inside the solid-state imaging device, resulting in the possibility that transmission and reception to and from an external substrate may become unstable.

The present technology has been created taking such a situation as described above into consideration, and it is an object of the present technology to eliminate restrictions in placement of an antenna for performing transmission and reception of a signal by wireless communication when the antenna is used together with a CSP.

Solution to Problems

The present technology has been made to solve the problems described above, and a first aspect of the present technology is a semiconductor device including a chip size package and a substrate. The chip size package includes a semiconductor element and a connection portion that electrically connects the semiconductor element and an outside to each other. The substrate includes an antenna connected to the connection portion for performing transmission and reception of a signal by wireless communication. This brings about an action that the antenna for performing transmission and reception of a signal in the chip size package is placed at any position of the substrate.

Further, in the first aspect, the substrate may include a conductive resin provided on a surface thereof that faces the chip size package. This brings about an action that an influence of electromagnetic noise when data transmission or reception is performed is reduced.

Further, in the first aspect, the conductive resin may be formed in such a manner as to avoid a position corresponding to the connection portion. This brings about an action that appropriate electric connection at the connection portion is secured.

Further, in the first aspect, the connection portion is assumed to be a solder bump, for example.

Further, in the first aspect, the semiconductor device may include an underfill provided between the chip size package and the substrate. This brings about an action that deformation of the substrate arising from a temperature change or an external stress is prevented. In this case, the underfill may include a non-conductive resin.

Further, in the first aspect, the substrate may further include a wire that connects a position corresponding to the connection portion and the antenna to each other. This brings about an action that the connection portion and the antenna are connected to each other.

Further, in the first aspect, the chip size package and the substrate may have sizes equal to each other. This brings about an action that they are handled as a package in which they are integrated with each other.

Further, in the first aspect, the semiconductor device may further include an external substrate that includes a second antenna for performing transmission and reception of the signal to and from the antenna of the substrate. This brings about an action that transmission and reception of a signal by wireless communication are performed between the substrate and the external substrate.

Further, in the first aspect, the substrate may further include a connection terminal that electrically connects the substrate and the external substrate to each other. In this case, as the connection terminal, only a power supply terminal and a ground terminal may be provided. Any other signal may be transmitted and received by wireless communication between the substrate and the external substrate.

Further, in the first aspect, the chip size package may have the connection portion provided therearound. This may be applied, for example, to a fan-out type chip size package.

Further, in the first aspect, the semiconductor element may be a solid-state imaging element. In other words, the semiconductor device may be an imaging device.

Moreover, a second aspect of the present technology is a manufacturing method of a semiconductor device including a step of forming a chip size package that includes a semiconductor element and a connection portion that electrically connects the semiconductor element and an outside to each other, a step of forming a substrate that includes an antenna for performing transmission and reception of a signal by wireless communication, a step of applying a conductive resin to a surface of the substrate in such a manner as to avoid a position corresponding to the connection portion, a step of connecting the chip size package and the substrate to each other at the connection portion, and a step of filling a gap between the chip size package and the substrate with an underfill. This brings about an action that a semiconductor device in which an antenna for performing transmission and reception of a signal in a chip size package is placed at any position of a substrate is manufactured.

BRIEF DESCRIPTION OF DRAWINGS

FIG. 1 is a cross sectional view depicting an example of an imaging device according to a first embodiment of the present technology.

FIGS. 2A, 2B, 2C, 2D, 2E, 2F, and 2G are views depicting an example of a manufacturing process of the imaging device according to the first embodiment of the present technology.

FIG. 4 is a cross sectional view depicting an example of an imaging device according to a second embodiment of the present technology.

FIGS. 5A, 5B, 5C, 5D, 5E, 5F, 5G, and 5H are views depicting an example of a manufacturing process of the imaging device according to the second embodiment of the present technology.

DESCRIPTION OF EMBODIMENTS

Figure 3:
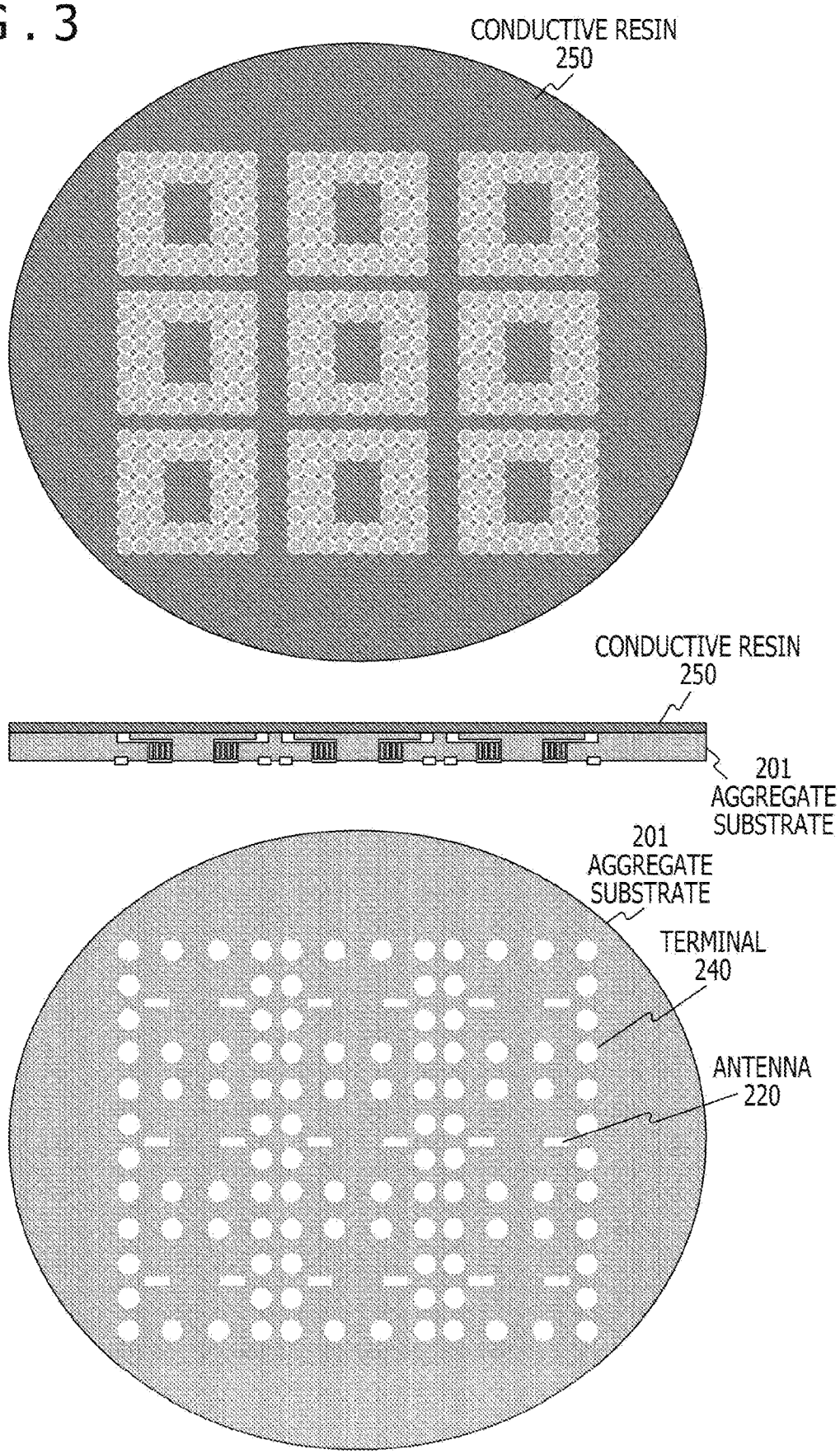
FIG. 3 is a view depicting a configuration example of an aggregate substrate 201 of the imaging device according to the first embodiment of the present technology.

In the following, modes for carrying out the present technology (each hereinafter referred to as an "embodiment") is described. The description is given in the following order:
1. First Embodiment (example of application to CSP)
2. Second Embodiment (example of application to fan-out type CSP)

1. First Embodiment

[Imaging Device]

FIG. 1 is a cross sectional view depicting an example of an imaging device according to a first embodiment of the present technology.

The imaging device includes a chip size package 100 and a substrate 210 that has a size equal to that of the chip size package 100 and is solder-connected to a lower side of the chip size package 100. The imaging device is configured such that an antenna 220 is provided on a lower face of the substrate 210 and performs transmission and reception of a signal by wireless communication to and from an external substrate 310. The antenna 220 is so shaped as to be capable of transmitting and receiving a radio wave, for example, of a millimeter wave band therethrough.

The chip size package 100 has a package structure in which a glass 140 is mounted on a front face of a solid-state imaging element 110 with a rib 150 interposed therebetween. The solid-state imaging element 110 includes a pixel area 120 on the front face thereof, and receives incident light through the glass 140 to generate an image signal by photoelectric conversion.

The solid-state imaging element 110 includes an RF (Radio Frequency) circuit that provides modulation and demodulation functions required for performing wireless communication. With the RF circuit, the solid-state imaging element 110 can transmit a generated image signal as image data 20 to the external substrate 310 and can receive a synchronization signal by wireless communication.

The chip size package 100 includes solder bumps 130 provided on a rear face of the solid-state imaging element 110. The chip size package 100 is electrically connected to the substrate 210 by use of the solder bumps 130 as terminals. It is to be noted that the solder bumps 130 are an example of a connection portion described in the claims.

Wires 230 connected to the solder bumps 130 on an upper face of the substrate 210 are connected to the antenna 220 on the lower face of the substrate 210. Since the wires 230 transmit a signal inside the substrate 210, the antenna 220 can be disposed at any position on the lower face of the substrate 210.

In order to block radio waves from the antenna 220, a conductive resin 250 is applied to the upper face of the substrate 210. The conductive resin 250 can reduce an influence of electromagnetic noise when data transmission and reception are performed. It is to be noted that, in order to secure appropriate electric connection of the chip size package 100 to the solder bumps 130, the application of the conductive resin 250 is performed in such a manner as to avoid positions where the solder bumps 130 are provided. The conductive resin 250 contains carbon or ferrite such that it can block radio waves from the antenna 220.

An underfill 190 is filled in a gap between the substrate 210 to which the conductive resin 250 is applied and the chip size package 100. As a result, deformation of the substrate 210 that could be caused by a temperature change or an external stress can be prevented. The underfill 190 preferably contains a non-conductive epoxy resin as a main compound, has a high elastic modulus, and has a linear expansion coefficient similar to that of silicon.

The external substrate 310 includes an antenna 320 similarly to the substrate 210. The antenna 320 makes wireless communication possible between the substrate 210 and the external substrate 310. In particular, the antenna 220 transmits the image data 20, which has been signal-converted for transmission, from the antenna 220 to the antenna 320 of the external substrate 310. On the other hand, a synchronization signal is transmitted from the antenna 320 to the antenna 220. At this time, in a case where the amount of data to be transmitted and received is great, a plurality of antennas 220 and a plurality of antennas 320 may be arranged.

Since such transmission and reception of a signal by wireless communication is possible, physical connection between the substrate 210 and the external substrate 310 can be used only for the power supply and the ground. In particular, terminals 240 for the power supply and the ground are placed around the antenna 220 on the lower face of the substrate 210. By the arrangement, the influence of electromagnetic noise from the wires of the external substrate 310 on the internal wires of the chip size package 100 and the substrate 210 can be reduced. The terminals 240 are connected to the external substrate 310 via solder balls 260. It is to be noted that the terminals 240 are an example of a connection terminal described in the claims.

[Manufacturing Method]

FIGS. 2A, 2B, 2O, 2D, 2E, 2F, and 2G are views depicting an example of a manufacturing process of the imaging device according to the first embodiment of the present technology.

First, pixel areas 120 of solid-state imaging elements 110 are formed on a wafer 101 as depicted in FIG. 2A. Then, ribs 150 are provided on the wafer 101 in such a manner as to avoid the pixel areas 120 of the solid-state imaging elements 110, and a glass 140 is stuck to the ribs 150 from above as depicted in FIG. 2B.

Thereafter, a rear face of the wafer 101 is polished such that the wafer 101 has a predetermined thickness as depicted in FIG. 2C. Then, wires are led out from the solid-state imaging elements 110, and solder bumps 130 are formed, as depicted in FIG. 2D. As a result, an aggregation of chip size packages 100 is formed.

Meanwhile, as an aggregate substrate 201, an aggregation of substrates 210 is formed. The aggregate substrate 201 has a conductive resin 250 applied to an upper face thereof as described above. The wafer 101 and the aggregate substrate 201 are equal in size and are joined together through the solder bumps 130 as depicted in FIG. 2E. Then, an underfill 190 is filled in a gap between the wafer 101 and the aggregate substrate 201 as depicted in FIG. 2F.

Then, after the underfill 190 is thermally cured, dicing is performed to obtain individual packages as depicted in FIG. 2G.

[Aggregate Substrate]

FIG. 3 is a view depicting a configuration example of the aggregate substrate 201 for the imaging device according to the first embodiment of the present technology.

As described hereinabove, the aggregate substrate 201 has a size equal to that of the wafer 101 and is joined to the wafer 101 through the solder bumps 130 in its manufacturing process. To the upper face of the aggregate substrate 201, the conductive resin 250 is applied in such a manner as to avoid the positions where the solder bumps 130 are provided.

Further, the antennas 220 are formed on a lower face of the aggregate substrate 201 to make wireless communication of the aggregate substrate 201 with the external substrate 310 possible. Consequently, the use purpose of the terminals 240 can be restricted to those for the power supply and the ground, and therefore, the number of terminals 240 can be reduced.

In such a manner, according to the first embodiment of the present technology, since the substrate 210 including the antenna 220 is provided under the chip size package 100 such that transmission and reception to and from the external substrate 310 are performed by wireless communication, the number of terminals 240 can be reduced.

2. Second Embodiment

While the first embodiment described above assumes the configuration that includes the solder bumps 130 provided on the rear face of the solid-state imaging element 110, a second embodiment assumes a fan-out type CSP. In particular, the second embodiment describes a package structure in which solder bumps are provided around a solid-state imaging element 110.

[Imaging Device]

FIG. 4 is a cross sectional view depicting an example of an imaging device according to the second embodiment of the present technology.

In the second embodiment, assuming a fan-out type CSP, solder bumps 131 are formed around a solid-state imaging element 110. The solid-state imaging element 110 and the solder bumps 131 are electrically connected to each other by wires not depicted.

To an upper face of a substrate 210, a conductive resin 250 is applied in such a manner as to avoid positions where the solder bumps 131 are provided as with the case of the first embodiment described above.

Further, in a gap between the substrate 210 to which the conductive resin 250 is applied and a chip size package 100, an underfill 191 is filled as with the case of the first embodiment described above.

FIGS. 5A, 5B, 5O, 5D, 5E, 5F, 5G, and 5H are views depicting an example of a manufacturing process of the imaging device according to the second embodiment of the present technology.

First, pixel areas 120 for solid-state imaging elements 110 are formed on a wafer 101 as depicted in FIG. 5A. Then, a rear face of the wafer 101 is polished such that the wafer 101 has a predetermined thickness as depicted in FIG. 5B. Then, dicing is performed to obtain individual solid-state imaging elements 110 as depicted in FIG. 5C.

Thereafter, glass 140 on which wires are patterned in advance is prepared as depicted in FIG. 5D. Then, the individual solid-state imaging elements 110 are stuck to the glass 140 at areas other than the pixel areas 120, and solder bumps 131 are formed as depicted in FIG. 5E.

Meanwhile, an aggregate of substrates 210 is formed as an aggregate substrate 201. The aggregate substrate 201 has a conductive resin 250 applied to an upper face thereof as described hereinabove. The wafer 101 and the aggregate substrate 201 are equal in size and are joined together through the solder bumps 131 as depicted in FIG. 5F. Then, an underfill 191 is filled in a gap between the wafer 101 and the aggregate substrate 201 as depicted in FIG. 5G.

Then, after the underfill 191 is thermally cured, dicing is performed to obtain individual packages as depicted in FIG. 5H.

[Aggregate Substrate]

Figure 6:
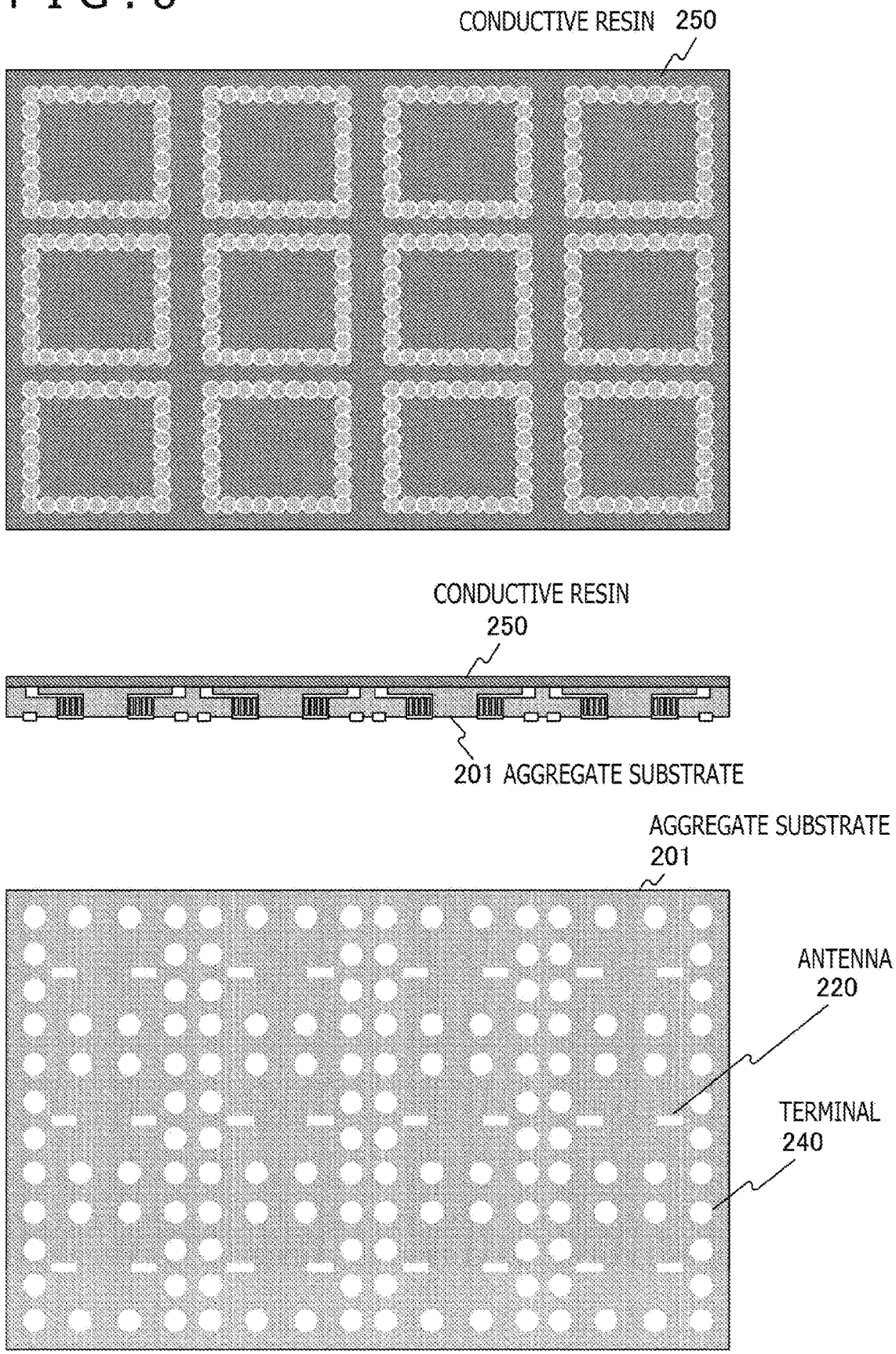

FIG. 6 is a view depicting a configuration example of the aggregate substrate 201 for the imaging device according to the second embodiment of the present technology.

As described hereinabove, the aggregate substrate 201 has a size equal to that of the wafer 101 and is joined to the wafer 101 through the solder bumps 131 in its manufacturing process. To the upper face of the aggregate substrate 201, the conductive resin 250 is applied in such a manner as to avoid the positions where the solder bumps 131 are provided. In the second embodiment, since the solder bumps 131 are formed around the solid-state imaging elements 110, the area to which the conductive resin 250 is applied is determined in consideration of such arrangement of the solder bumps 131.

Further, as with the case of the first embodiment described above, antennas 220 are formed on a lower face of the aggregate substrate 201 to make wireless communication with an external substrate 310 possible. Consequently, the use purpose of terminals 240 can be restricted to those for the power supply and the ground, and therefore, the number of terminals 240 can be reduced.

In such a manner, according to the second embodiment of the present technology, also in a fan-out type CSP, the number of terminals 240 can be reduced by performing transmission and reception to and from the external substrate 310 by wireless communication.

In particular, according to the embodiments of the present technology, even if the imaging device is increased in pixel count and in frame rate, the number of terminals connected to the external substrate 310 can be reduced. Therefore, a package free from a problem regarding solder mounting can be realized while it is a package of a size equivalent to that of a semiconductor chip. Further, since the image data 20 of the imaging device can wirelessly be transmitted to and received from the external substrate 310, there is no need to provide wires to establish connection to the external substrate 310, so that there is no need to increase the wiring density in the package. Therefore, noise by interference of electromagnetic waves, which is caused by reduction in wiring distance in the package, can be reduced, and also routing of the wires can be shortened. Consequently, the transmission loss of a signal can also be reduced. Further, since it is possible to perform package assembly in a state of a wafer size of the solid-state imaging element 110, the imaging device can be manufactured at a low cost. Further, since dicing is performed to obtain individual packages, packages can be manufactured with high accuracy.

It is to be noted that the embodiments described above represent examples for embodying the present technology, and matters in the embodiments and matters to specify the invention in the claims have respective corresponding relations to each other. Similarly, the matters to specify the invention in the claims and matters in the embodiments of the present technology denoted by identical names have respective corresponding relations to each other. However, the present technology is not limited to the embodiments and can be embodied by applying various modifications to the embodiments without departing from the subject matter of the present technology.

It is to be noted that the advantageous effects described in the present specification are exemplary to the last and are not restrictive, and other advantageous effects may be presented.

It is to be noted that the present technology can also adopt such configurations as described below.

(1) A semiconductor device including:
a chip size package including a semiconductor element and a connection portion that electrically connects the semiconductor element and an outside to each other; and
a substrate including an antenna connected to the connection portion for performing transmission and reception of a signal by wireless communication.

(2) The semiconductor device according to (1) above, in which
the substrate includes a conductive resin provided on a surface thereof that faces the chip size package.

(3) The semiconductor device according to (2) above, in which
the conductive resin is formed in such a manner as to avoid a position corresponding to the connection portion.

(4) The semiconductor device according to any one of (1) to (3) above, in which
the connection portion includes a solder bump.

(5) The semiconductor device according to any one of (1) to (4) above, including:
an underfill provided between the chip size package and the substrate.

(6) The semiconductor device according to (5) above, in which
the underfill includes a non-conductive resin.

(7) The semiconductor device according to any one of (1) to (6) above, in which
the substrate further includes a wire that connects a position corresponding to the connection portion and the antenna to each other.

(8) The semiconductor device according to any one of (1) to (7) above, in which
the chip size package and the substrate have sizes equal to each other.

(9) The semiconductor device according to any one of (1) to (8) above, further including:
an external substrate that includes a second antenna for performing transmission and reception of the signal to and from the antenna of the substrate.

(10) The semiconductor device according to (9) above, in which
the substrate further includes a connection terminal that electrically connects the substrate and the external substrate to each other.

(11) The semiconductor device according to (10) above, in which,
as the connection terminal, only a power supply terminal and a ground terminal are provided.

(12) The semiconductor device according to any one of (1) to (11) above, in which
the chip size package has the connection portion provided therearound.

(13) The semiconductor device according to any one of (1) to (12) above, in which
the semiconductor element includes a solid-state imaging element.

(14) A manufacturing method of a semiconductor device, including:
a step of forming a chip size package that includes a semiconductor element and a connection portion that electrically connects the semiconductor element and an outside to each other;
a step of forming a substrate that includes an antenna for performing transmission and reception of a signal by wireless communication;
a step of applying a conductive resin to a surface of the substrate in such a manner as to avoid a position corresponding to the connection portion;
a step of connecting the chip size package and the substrate to each other at the connection portion; and
a step of filling a gap between the chip size package and the substrate with an underfill.

REFERENCE SIGNS LIST

20: Image data
100: Chip size package
101: Wafer
110: Solid-state imaging element
120: Pixel area
130, 131: Solder bump
140: Glass
150: Rib
190, 191: Underfill
201: Aggregate substrate
210: Substrate
220: Antenna
230: Wire
240: Terminal
250: Conductive resin
260: Solder ball
310: External substrate
320: Antenna

The invention claimed is:

1. A semiconductor device, comprising:
   a substrate; and
   a chip size package that includes:
   a semiconductor element,
   a glass on a front surface of the semiconductor element, and
   a connection portion configured to electrically connect the semiconductor element and the substrate, wherein
   the substrate includes a first antenna connected to the connection portion, wherein the first antenna is configured to execute each of transmission of a first signal and reception of a second signal by wireless communication.

2. The semiconductor device according to claim 1, further comprising a conductive resin on an upper surface of the substrate, wherein
   the upper surface faces the chip size package.

3. The semiconductor device according to claim 2, wherein the conductive resin includes carbon or ferrite.

4. The semiconductor device according to claim 1, wherein the connection portion includes a solder bump.

5. The semiconductor device according to claim 1, further comprising an underfill between the substrate and the semiconductor element of the chip size package.

6. The semiconductor device according to claim 5, wherein the underfill includes a non-conductive resin.

7. The semiconductor device according to claim 1, wherein the substrate further includes a wire configured to connect the first antenna to a position corresponding to the connection portion.

8. The semiconductor device according to claim 1, wherein a width of the chip size package is equal to a width of the substrate.

9. The semiconductor device according to claim 1, further comprising an external substrate external to the chip size package, wherein
   the external substrate includes a second antenna, and
   the second antenna is configured to execute each of transmission of the second signal to the first antenna, and reception of the first signal from the first antenna.

10. The semiconductor device according to claim 9, wherein the substrate further includes a plurality of connection terminals configured to electrically connect the substrate and the external substrate.

11. The semiconductor device according to claim 10, wherein, the plurality of connection terminals includes a power supply terminal and a ground terminal.

12. The semiconductor device according to claim 1, wherein the connection portion is within a vicinity of the semiconductor element.

13. The semiconductor device according to claim 1, wherein the semiconductor element includes a solid-state imaging element.

14. The semiconductor device according to claim 1, wherein the chip size package further includes a rib between the glass and the semiconductor element.

15. The semiconductor device according to claim 1, wherein
   the semiconductor element includes a pixel area on the front surface of the semiconductor element, and
   the pixel area is configured to receive incident light through the glass.

16. The semiconductor device according to claim 10, wherein the plurality of connection terminals is configured to electrically connect the substrate and the external substrate via a plurality of solder balls.

* * * * *